United States Patent
Park et al.

(10) Patent No.: US 8,618,407 B2
(45) Date of Patent: Dec. 31, 2013

(54) SOLAR CELLS HAVING NANOWIRES AND METHODS OF FABRICATING NANOWIRES

(75) Inventors: Young-jun Park, Suwon-si (KR); Chan-wook Baik, Yongin-si (KR)

(73) Assignee: Samsung Electronics Co., Ltd., Gyeonggi-Do (KR)

(*) Notice: Subject to any disclaimer, the term of this patent is extended or adjusted under 35 U.S.C. 154(b) by 774 days.

(21) Appl. No.: 12/656,829

(22) Filed: Feb. 17, 2010

(65) Prior Publication Data

US 2011/0041900 A1   Feb. 24, 2011

(30) Foreign Application Priority Data

Aug. 18, 2009   (KR) .................. 10-2009-0076389

(51) Int. Cl.
*H01L 31/0248* (2006.01)
*H01L 31/0352* (2006.01)

(52) U.S. Cl.
USPC .......................................... 136/252; 136/256

(58) Field of Classification Search
USPC ................................................ 136/243–265
See application file for complete search history.

(56) References Cited

U.S. PATENT DOCUMENTS

| | | | |
|---|---|---|---|
| 6,891,191 | B2 | 5/2005 | Xiao et al. |
| 2005/0126628 | A1* | 6/2005 | Scher et al. .................. 136/263 |
| 2006/0207647 | A1* | 9/2006 | Tsakalakos et al. .......... 136/256 |
| 2007/0025139 | A1 | 2/2007 | Parsons |
| 2008/0006319 | A1 | 1/2008 | Bettge et al. |
| 2009/0050204 | A1 | 2/2009 | Habib |

FOREIGN PATENT DOCUMENTS

| | | |
|---|---|---|
| JP | 2006-261666 | 9/2006 |
| JP | 2007-142386 | 6/2007 |
| KR | 10-2008-0044181 | 5/2008 |
| KR | 10-2009-0025229 | 3/2009 |
| KR | 10-2009-0035343 | 4/2009 |

* cited by examiner

*Primary Examiner* — Jonathan Johnson
*Assistant Examiner* — Christina Chern
(74) *Attorney, Agent, or Firm* — Harness, Dickey & Pierce, P.L.C.

(57) ABSTRACT

A solar cell includes a plurality of nanowires arranged such that diameters of the nanowires sequentially increase in a first direction along a path of incident light. In a method of forming nanowires, a catalyst layer is formed on a substrate, a plurality of nanoparticles are formed by thermally processing the catalyst layer, and nanowires are grown from the plurality of nanoparticles. The catalyst layer has a thickness that increases in a first direction, and the plurality of nanoparticles have diameters that increase in the first direction.

10 Claims, 5 Drawing Sheets

SOLAR CELLS HAVING NANOWIRES AND METHODS OF FABRICATING NANOWIRES

CROSS-REFERENCE TO RELATED APPLICATION(S)

This application claims priority under 35 U.S.C. §119 to Korean Patent Application No. 10-2009-0076389, filed on Aug. 18, 2009, in the Korean Intellectual Property Office, the entire contents of which are incorporated herein by reference.

BACKGROUND

1. Field

Example embodiments relate to solar cells having nanowires and methods of fabricating nanowires.

2. Description of the Related Art

Conventionally, a solar cell is fabricated by doping an impurity into a substrate such as a silicon wafer. A solar cell fabricated in this way exhibits an efficiency from about 15% to about 20% because of single band gap limits and losses due to defects. Recently, research for controlling a band gap by forming a solar cell including nanostructures such as nanowires, or for manipulating physical characteristics of nanostructures, are being performed for improving efficiency of a solar cell.

Meanwhile, when growing a nanostructure such as a nanowire, a metal catalyst layer is formed having a desired thickness on a surface of a substrate by using a method such as nanoparticle coating, resistive heating, electron beam deposition, or sputtering, to control the diameter of the nanostructure. In this case, only nanostructures having the same diameter may be grown from the catalyst layer because the metal catalyst layer is formed having a uniform thickness on the substrate. Moreover, it is relatively difficult to fabricate nanostructures having different diameters.

SUMMARY

Example embodiments provide solar cells including nanowires that are arranged such that diameters of the nanowires sequentially increase in a direction along a path of incident light and methods of fabricating the nanowires.

Additional aspects will be set forth in part in the description which follows and, in part, will be apparent from the description, or may be learned by practice of one or more example embodiments.

At least one example embodiment provides a solar cell. According to at least this example embodiment, the solar cell includes a plurality of nanowires arranged such that diameters of the nanowires sequentially increase in a direction along a path of incident light (e.g., sunlight). The solar cell further includes: a coating layer formed on the nanowires to form p-n junctions with the nanowires; a first electrode electrically connected to the nanowires; and a second electrode electrically connected to the coating layers.

According to at least some example embodiments, the coating layer may be formed to surround each of the nanowires. Alternatively, the coating layer may be formed to cover the nanowires. The nanowires may be formed of a p-type material, and the coating layer may be formed of an n-type material. Alternatively, the nanowires may be formed of an n-type material, and the coating layer may be formed of a p-type material. The nanowires may include a semiconductor material, and diameters of the nanowires may be between about 1 nm and about 1 μm, inclusive. The nanowires may include nanotubes or nanorods.

At least one other example embodiment provides a method of forming nanowires. According to at least this example embodiment, the method includes: forming a catalyst layer, which has a thickness that increases in a first direction, on a substrate; forming a plurality of nanoparticles by thermally processing the catalyst layer; and growing nanowires from the nanoparticles. Diameters of the nanoparticles increase in the first direction.

According to at least some example embodiments, the grown nanowires may be arranged such that the diameters of the nanowires sequentially increase in the first direction. A surface of the substrate on which the catalyst layer may be formed is, vertical, substantially vertical or tilted with respect to a top surface of a base unit supporting the substrate. Meanwhile, the catalyst layer may be formed on a tilted surface that is formed by taper etching the substrate.

According to at least some example embodiments, the catalyst layer may be formed using an electron beam deposition method or a sputtering method. The forming of the catalyst layer may include: forming a buffer layer on the substrate having a thickness that sequentially decreases in the first direction; forming a catalyst material layer having a uniform or substantially uniform thickness on the buffer layer; and forming the catalyst layer having a thickness that sequentially increases in the first direction by forming a compound layer via reaction between the buffer layer and the catalyst material layer.

According to at least some example embodiments, the catalyst layer may be thermally processed within a temperature range from about 300° C. to about 600° C., inclusive. The nanowires may be grown by using, for example, a chemical vapor deposition (CVD) method.

BRIEF DESCRIPTION OF THE DRAWINGS

Example embodiments will become more apparent and readily appreciated from the following description of the accompanying drawings in which.

DETAILED DESCRIPTION

Figure 1:
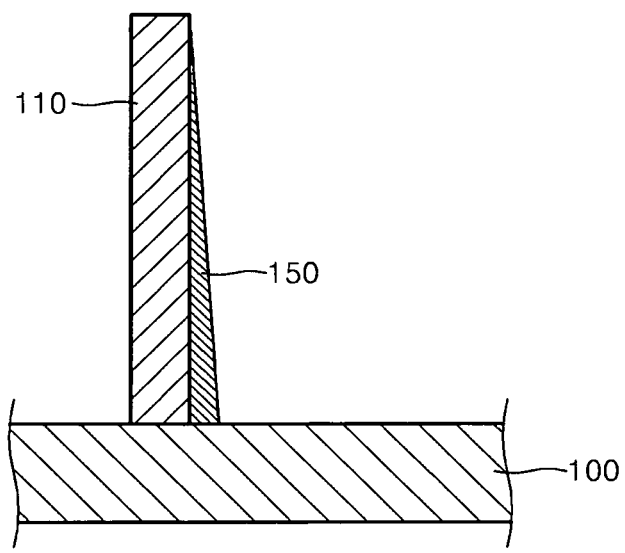
FIGS. 1 through 3 are diagrams for describing a method of fabricating nanowires according to an example embodiment.

Inventive concepts will now be described more fully with reference to the accompanying drawings, in which example embodiments are shown. In the drawings, the thicknesses of layers and regions are exaggerated for clarity. Like reference numerals in the drawings denote like elements.

Detailed illustrative embodiments are disclosed herein. However, specific structural and functional details disclosed herein are merely representative for purposes of describing example embodiments. Inventive concepts may, however, may be embodied in many alternate forms and should not be construed as limited to only the example embodiments set forth herein.

It should be understood, however, that there is no intent to limit inventive concepts to the particular example embodiments disclosed, but on the contrary example embodiments are to cover all modifications, equivalents, and alternatives falling within the scope of the inventive concepts. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or," includes any and all combinations of one or more of the associated listed items.

It will be understood that when an element is referred to as being "connected," or "coupled," to another element, it can be directly connected or coupled to the other element or intervening elements may be present. In contrast, when an element is referred to as being "directly connected," or "directly coupled," to another element, there are no intervening elements present. Other words used to describe the relationship between elements should be interpreted in a like fashion (e.g., "between," versus "directly between," "adjacent," versus "directly adjacent," etc.).

The terminology used herein is for the purpose of describing particular embodiments only and is not intended to be limiting. As used herein, the singular forms "a," "an," and "the," are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Figure 2:
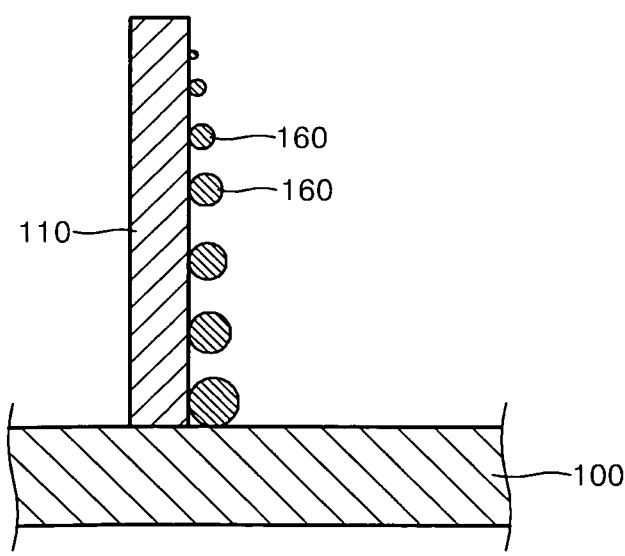
Figure 3:
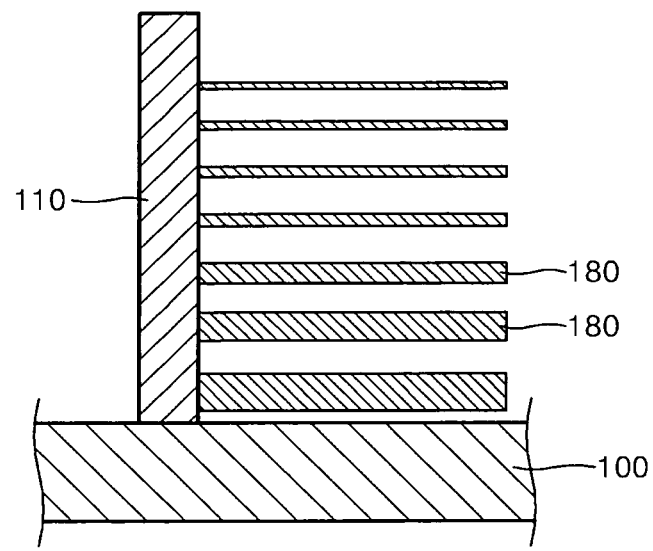

FIGS. 1 through 3 are diagrams for describing a method of fabricating nanowires according to an example embodiment.

Referring to FIG. 1, a substrate 110 is prepared on a base unit 100. In this example, the substrate 110 may be disposed vertically or substantially vertically with respect to a top surface of the base unit 100. Alternatively, the substrate 110 may be disposed tilted at a given, desired or predetermined angle with respect to the top surface of the base unit 100. A catalyst layer 150 is then formed on the substrate 100. The catalyst layer 150 is formed to have a thickness that varies in a first direction. In more detail, the catalyst layer 150 shown in FIG. 1 has a thickness that gradually increases in a downward direction with respect to the substrate 110 in FIG. 1. The catalyst layer 150 may be formed using an electron beam deposition method or a sputtering method, for example. The catalyst layer 150 having a varying thickness may be formed using a method of depositing by using, for example, a surface of either the vertical, substantially vertical, or the tilted substrate 110 or a tilt depositing method. The catalyst layer 150 may be formed of any of various materials used to grow nanowires (e.g., 180 in FIG. 3). For example, the catalyst layer 150 may be formed of a metal such as gold (Au), iron (Fe), cobalt (Co), nickel (Ni), or the like. However, materials for forming the catalyst layer 150 are not limited to these examples.

Referring to FIG. 2, nanoparticles 160 having different diameters are formed on the substrate 110 by thermally processing the catalyst layer 150 at a given, desired or predetermined temperature. The catalyst layer 150 may be thermally processed in various temperature ranges according to the material from which the catalyst layer 150 is formed. For example, the catalyst layer 150 may be thermally processed at a temperature between about 300° C. and about 600° C., inclusive. However, temperature ranges for thermally processing the catalyst layer 150 are not limited thereto. Accordingly, when the catalyst layer 150 is thermally processed, a plurality of the nanoparticles 160 may be formed. The plurality of nanoparticles 160 may have diameters that increase in the direction. In this example, nanoparticles with relatively large diameters are formed of portions of the catalyst layer 150 with relatively large thicknesses on the substrate 110.

Referring to FIG. 3, nanowires 180 are grown from the nanoparticles 160 having different diameters and are formed on the substrate 110. In this example, the growing of the nanowires 180 may be performed using, for example, chemical vapor deposition (CVD). As a result, a plurality of the nanowires 180 having diameters that increase in the first direction are formed on the substrate 110. The nanowires 180 grown from the nanoparticles 160 may be formed having diameters between about 1 nm and about 1 μm, inclusive. However, diameters of the nanowires 180 are not limited thereto. In this example, the nanowires 180 are nanostructures having nanosize diameters, and the nanowires may include nanotubes, in which an interior is empty, and nanorods, in which an interior is full.

Figure 4:
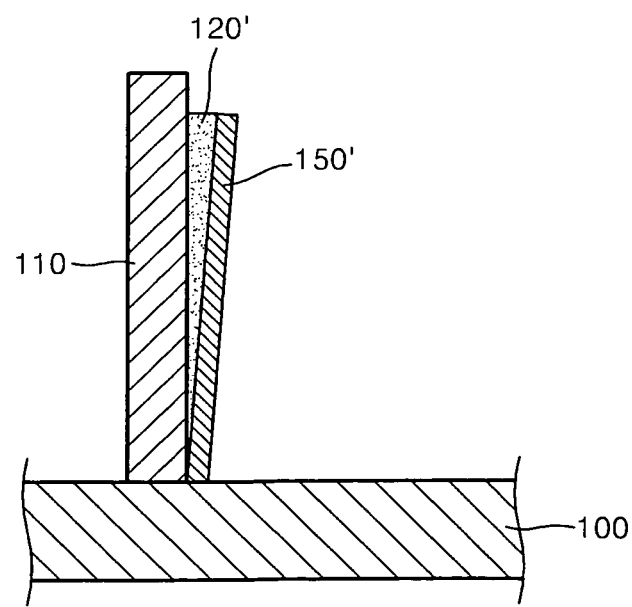
FIGS. 4 and 5 are diagrams for describing a method of fabricating nanowires according to another example embodiment.
Figure 5:
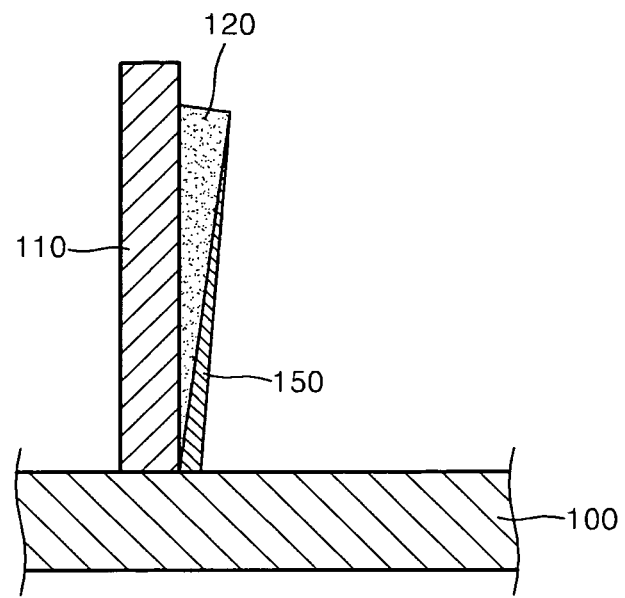

FIGS. 4 and 5 are diagrams for describing a method of fabricating nanowires according to another example embodiment.

Referring to FIG. 4, a buffer layer 120' is formed on the substrate 110, which is prepared on the base unit 100. The buffer layer 120' has a thickness that varies or changes in a first direction. In more detail, the buffer layer 120' shown in FIG. 4 has a thickness that decreases in a downward direction with respect to the substrate 110. The buffer layer 120' may be formed of a material that reacts with a catalyst material layer 150' described in more detail below to form a layer of a given, desired or predetermined compound (e.g., 120 in FIG. 5). The buffer layer 120' may be formed using, for example, an electron beam deposition method or a sputtering method. However, methods of forming the buffer layer 120' are not limited thereto.

The catalyst material layer 150' having a uniform or substantially uniform thickness is then formed on the buffer layer 120'. The catalyst material layer 150' may be formed of (any of) various materials used to grow nanowires (e.g., 180 in FIG. 3). For example, the catalyst material layer 150' may be formed of a metal such as Au, Fe, Co, Ni, or the like. However, materials for forming the catalyst material layer 150' are not limited thereto. As with the buffer layer 120', the catalyst material layer 150' may also be formed using, for example, an electron beam deposition method or a sputtering method.

As shown in FIG. 4, when the catalyst material layer 150' having a uniform or substantially uniform thickness is formed on the buffer layer 120' having a thickness that gradually decreases in the first direction, the buffer layer 120' and the catalyst material layer 150' react with each other to form the given, desired or predetermined compound layer 120. Remaining portions of the catalyst material layer 150' that do not react with the buffer layer 120' serve as the catalyst layer 150 on the compound layer 120. As a result, the compound layer 120 is formed on the substrate 110 having a thickness that gradually decreases in the first direction, whereas the catalyst layer 150 is formed on the compound layer 120 having a thickness that gradually increases in the first direction:

Operations for forming the nanoparticles 160 having different diameters by thermally processing the catalyst layer 150 and operations for forming the nanowires 180 having different diameters from the nanoparticles 160 are described in detail with regard to FIGS. 1 through 3, and thus, detailed descriptions thereof are omitted here. As described above, the nanowires 180 having different diameters may be formed on the substrate 110 by forming the catalyst layer 150 having a thickness that changes or varies in a first direction.

Figure 6:
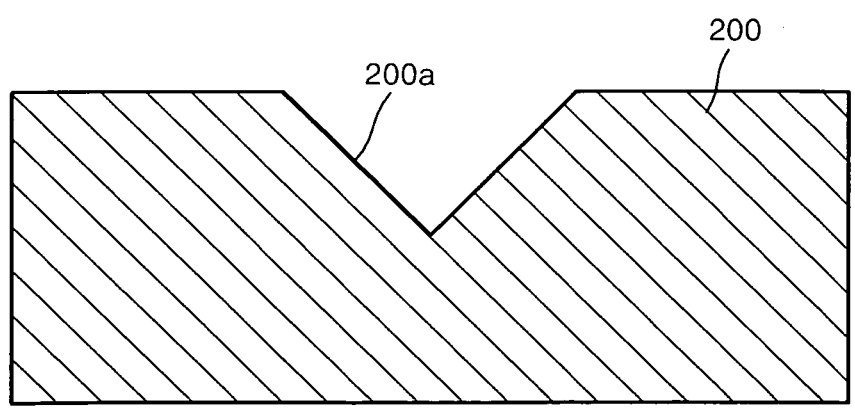
FIG. 6 shows a substrate having a tilted surface and which may be applied to example embodiments.

An example in which the substrate 110, which is disposed either vertically, substantially vertically or tilted with respect to the top surface of the base unit 100, is used to form the catalyst layer 150 is described in the above example embodiments. However, example embodiments are not limited thereto. As shown in FIG. 6, a tilted surface 200a may be formed by taper etching a substrate 200. The catalyst layer 150 having a thickness that changes in a first direction may be formed on the tilted surface 200a of the substrate 200.

Meanwhile, when the nanowires 180 are arranged such that diameters of the nanowires 180 sequentially increase in the first direction and when the nanowires 180 are applied to a solar cell, the nanowires 180 enable absorption of incident light (e.g., sunlight) over a wide-band of wavelengths. As a result, efficiency of the solar cell may be improved.

Figure 7:
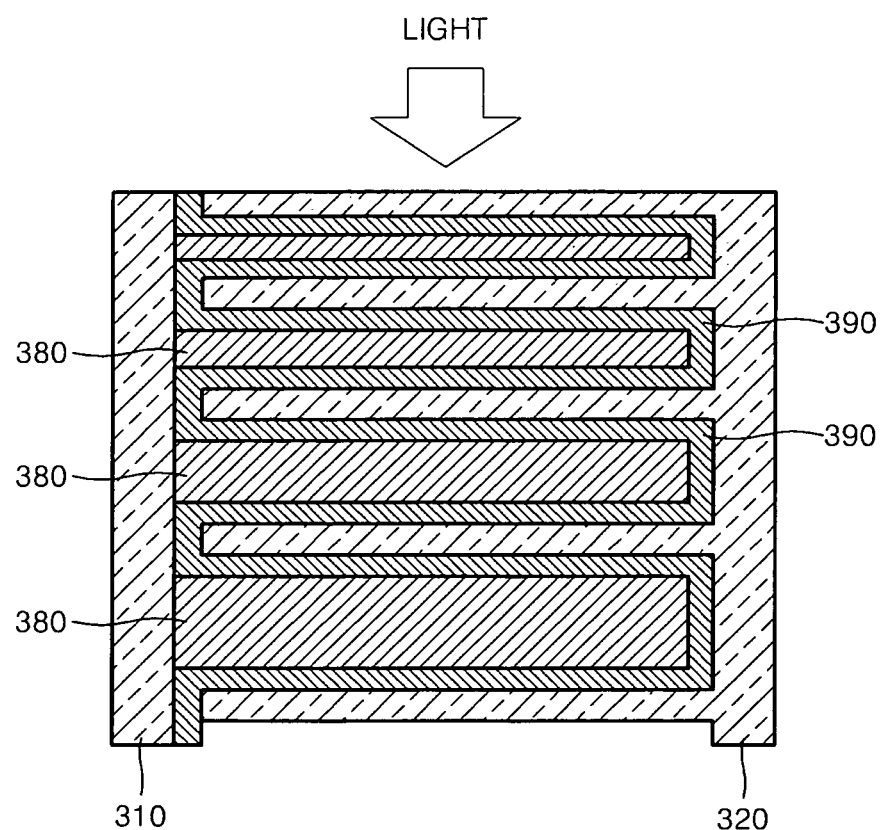
FIG. 7 is a schematic sectional view of a solar cell according to another example embodiment.

FIG. 7 is a schematic sectional view of a solar cell according to an example embodiment.

Referring to FIG. 7, the solar cell according to at least this example embodiment includes: a plurality of nanowires 380; a coating layer 390 formed on the nanowires 380; a first electrode 310 electrically connected to the nanowires 380; and a second electrode 320 electrically connected to the coating layer 390.

The nanowires 380 may be arranged such that diameters of the nanowires 380 sequentially increase in a first direction along a path of incident light (e.g., sunlight). In this example, each of the nanowires 380 may have a diameter between about 1 nm and about 1 µm, inclusive. For example, the nanowires 380 may have diameters between about 1 nm and about 50 nm, inclusive. However, diameters of the nanowires 380 are not limited thereto. The nanowires 380 may be formed of a p-type material or an n-type material. For example, the nanowires 380 may be formed of a semiconductor material, such as, Si, ZnO, $TiO_2$, GaAs, InGaN, etc. The nanowires 380 are electrically connected to the first electrode 310, which is disposed on a side of the nanowires 380.

The coating layer 390 is formed to surround each of the nanowires 380. The coating layer 390 is combined with the nanowires 380 to form a p-n junction structure. Thus, the coating layer 390 may be formed of an n-type material or a p-type material. In more detail, the coating layer 390 may be formed of an n-type material when the nanowires 380 are formed of a p-type material, and the coating layer 390 may be formed of a p-type material when the nanowires 380 are formed of an n-type material. The coating layer 390 may include a semiconductor material, such as, Si, ZnO, $TiO_2$, GaAs, InGaN, etc. In this example, the coating layer 390 may be formed of the same or substantially the same type of material as the nanowires 380. However, example embodiments are not limited thereto. Rather, the coating layer 390 may be formed of a different type of material as compared to the nanowires 380 for changing the band gap. The coating layer 390 is electrically connected to the second electrode 320. Moreover, although it is shown that the solar cell described above has a p-n junction structure, the solar cell may alternatively have a p-i-n junction structure. In this case, an intrinsic semiconductor layer (not shown) may be formed between the nanowires 380 and the coating layer 390.

As described above, the nanowires 380 are arranged such that diameters of the nanowires 380 sequentially increase in the direction along the path of incident light (e.g., sunlight). In addition, efficiency of a solar cell may be improved by absorbing incident light (e.g., sunlight) over a wide-band of wavelengths. In more detail, the nanowire 380 having the smallest diameter from among the nanowires 380 (e.g., an upper most nanowire in FIG. 7) has a larger band gap than others among the nanowires 380. Thus, the nanowire 380 having the smallest diameter may absorb ultraviolet (UV) light or blue light from incident light (e.g., sunlight). Furthermore, the nanowire 380 having the greatest diameter from among the nanowires 380 (e.g., bottom nanowire in FIG. 7) has a smaller band gap than others among the nanowires 380, and thus, the nanowire 380 having the greatest diameter may absorb red light from incident light (e.g., sunlight). Thus, as shown in FIG. 7, when light (e.g., sunlight) is incident, the nanowires 380 that are arranged such that diameters of the nanowires 380 sequentially increase in the direction from which light (e.g., sunlight) is incident may absorb light (e.g., sunlight) over a wide-band of wavelengths, from UV light wavelength or blue light wavelength to red light wavelength.

Figure 8:
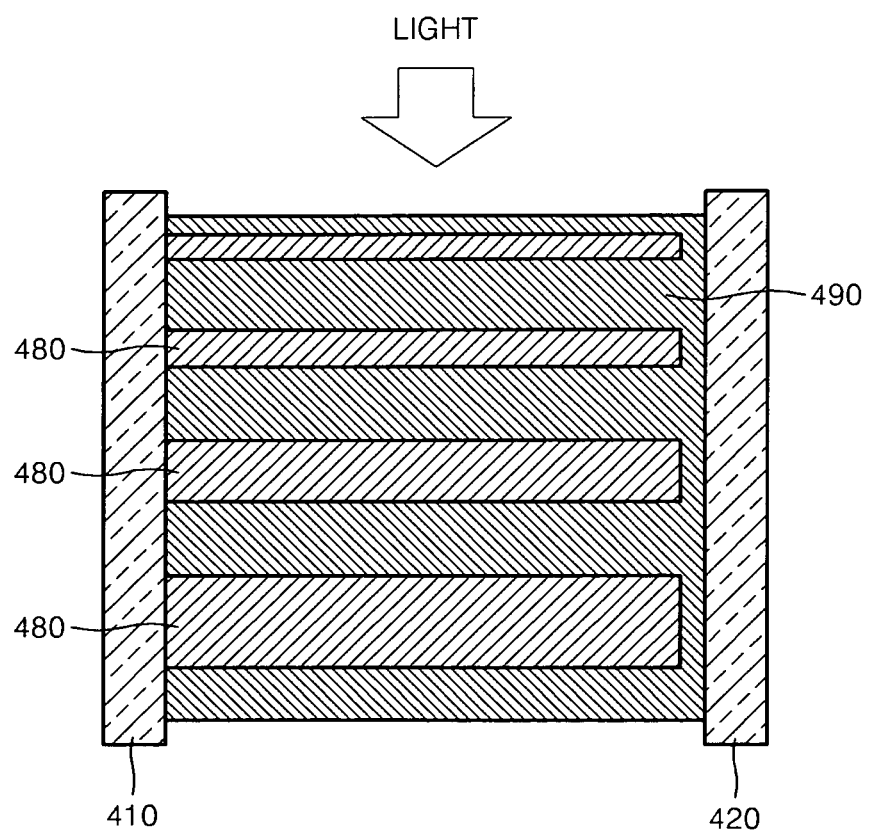
FIG. 8 is a schematic sectional view of a solar cell according to another example embodiment.

FIG. 8 is a schematic sectional view of a solar cell according to another example embodiment.

Referring to FIG. 8, the solar cell includes: a plurality of nanowires 480; a coating layer 490 formed on the plurality of nanowires 480; a first electrode 410 electrically connected to the nanowires 480; and a second electrode 420 electrically connected to the coating layer 490.

The plurality of nanowires 480 are arranged such that diameters of the nanowires 480 sequentially increase in the direction from which light (e.g., sunlight) is incident. In this example, each of the plurality of nanowires 480 may have a diameter between about 1 nm and about 1 µm, inclusive (e.g., between about 1 nm and about 50 nm, inclusive). The plurality of nanowires 480 may be formed of a p-type material or an n-type material. The nanowires 480 may include a semiconductor material, such as, Si, ZnO, $TiO_2$, GaAs, InGaN, etc. The nanowires 480 are electrically connected to the first electrode 310, which is disposed on a side of the nanowires 380.

The coating layer 490 is formed to cover the plurality of nanowires 480. The coating layer 490 is combined with the plurality of nanowires 480 and forms a p-n junction structure. Thus, the coating layer 490 may be formed of an n-type material or a p-type material. In more detail, the coating layer 490 may be formed of an n-type material when the nanowires 480 are formed of a p-type material, and the coating layer 490 may be formed of a p-type material when the nanowires 480 are formed of an n-type material. The coating layer 490 may include a semiconductor material, such as, Si, ZnO, $TiO_2$, GaAs, InGaN, etc. In this example, the coating layer 490 may be formed of the same or substantially the same type of material as the nanowires 480. However, example embodiments are not limited thereto. Rather, the coating layer 490 may be formed of a different type of material as compared to the nanowires 480 for changing the band gap. The coating layer 490 is electrically connected to the second electrode 420.

Although the solar cell shown in FIG. 8 is described above as including a p-n junction structure, the solar cell may alternatively have a p-i-n junction structure. In this example, an intrinsic semiconductor layer (not shown) may be further formed between the plurality of nanowires 480 and the coating layer 490.

As in the above-described example embodiment, a solar cell may include a plurality of nanowires 480 having different diameters with different band gaps for absorbing light (e.g., sunlight) over a wide-band of wavelengths, and thus, efficiency of the solar cell may be improved.

As described above, according to the one or more example embodiments, nanowires of which diameters sequentially increase in a first direction may be fabricated by forming a catalyst layer of which the thickness sequentially increases in the first direction. Furthermore, when nanowires arranged such that diameters of the nanowires sequentially increase in the first direction are used in a solar cell, the solar cell may be able to absorb wide-band wavelengths of light (e.g., sunlight), and thus, efficiency of the solar cell may be improved.

It should be understood that example embodiments described herein should be considered in a descriptive sense only and not for purposes of limitation. Descriptions of features or aspects within each example embodiment should typically be considered as available for other similar features or aspects in other example embodiments.

What is claimed is:

1. A solar cell comprising:
   a plurality of nanowires arranged such that diameters of the plurality of nanowires sequentially increase with each adjacent nanowire in a first direction along a path of incident light;
   a coating layer formed on the plurality of nanowires to form p-n junctions with the plurality of nanowires;
   a first electrode electrically connected to the plurality of nanowires; and
   a second electrode electrically connected to the coating layer.

2. The solar cell of claim 1, wherein the coating layer is formed to surround each of the plurality of nanowires.

3. The solar cell of claim 1, wherein the coating layer is formed to cover the plurality of nanowires.

4. The solar cell of claim 1, wherein the plurality of nanowires are formed of a p-type material and the coating layer is formed of an n-type material.

5. The solar cell of claim 1, wherein the plurality of nanowires are formed of an n-type material and the coating layer is formed of a p-type material.

6. The solar cell of claim 1, wherein the plurality of nanowires include a semiconductor material.

7. The solar cell of claim 1, wherein the diameters of the plurality of nanowires are between about 1 nm and about 1 μm, inclusive.

8. The solar cell of claim 1, wherein the plurality of nanowires include one of nanotubes and nanorods.

9. The solar cell of claim 1, wherein
   the first electrode includes one surface having a plurality of first interfaces with the plurality of nanowires and a plurality of a second interfaces with the coating layer, and
   the plurality of first interfaces and the plurality of second interfaces are alternately arranged along the one surface of the first electrode.

10. The solar cell of claim 1, wherein
    the second electrode includes a plurality of protruding portions that extend interdigitated between the plurality of nanowires, and
    the coating layer includes portions that are between the first electrode and the plurality of protruding portions of the second electrode.

* * * * *